United States Patent
Shtulman et al.

(10) Patent No.: US 8,707,117 B2
(45) Date of Patent: Apr. 22, 2014

(54) METHODS AND APPARATUS TO TEST MULTI CLOCK DOMAIN DATA PATHS WITH A SHARED CAPTURE CLOCK SIGNAL

(75) Inventors: Ari Shtulman, Ft. Collins, CO (US); Karen Tucker, Ft. Collins, CO (US); Ahmet Tokuz, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 634 days.

(21) Appl. No.: 12/908,630

(22) Filed: Oct. 20, 2010

(65) Prior Publication Data

US 2012/0102376 A1    Apr. 26, 2012

(51) Int. Cl.
*G01R 31/08* (2006.01)
(52) U.S. Cl.
USPC ........................................................ 714/731
(58) Field of Classification Search
USPC ........................................................ 714/731
See application file for complete search history.

(56) References Cited

U.S. PATENT DOCUMENTS

| | | | |
|---|---|---|---|
| 5,680,543 A | 10/1997 | Bhawmik | |
| 2008/0010573 A1* | 1/2008 | Sul | 714/731 |
| 2009/0132880 A1 | 5/2009 | Wang et al. | |
| 2010/0287430 A1* | 11/2010 | Wang et al. | 714/731 |
| 2012/0166903 A1* | 6/2012 | Wang et al. | 714/731 |
| 2012/0173943 A1* | 7/2012 | Cesari | 714/731 |

OTHER PUBLICATIONS

Salman, E., et al. "Exploiting Setup-Hold-Time Interdependence in Static Timing Analysis," IEEE Transactions on Computer-Aided Design of Integrated Circuits and Systems, vol. 26, No. 6. Jun. 2007. pp. 1114-1125.

* cited by examiner

*Primary Examiner* — Amine Riad

(57) ABSTRACT

Methods, circuits and systems are provided to test data paths that traverse multiple clock domains using a common capture clock that is applied to multiple domains. Test data is launched to a first clock domain, and each of the clock domains is selected to receive the common capture clock signal while the test data propagates through the selected clock domain. The test data is capture after it has propagated through each of the multiple domains in response to the shared domains. Applying a common capture clock to each of the different domains eliminates hold time errors that might otherwise occur as the data transitions from one clock domain to another.

18 Claims, 3 Drawing Sheets

METHODS AND APPARATUS TO TEST MULTI CLOCK DOMAIN DATA PATHS WITH A SHARED CAPTURE CLOCK SIGNAL

TECHNICAL FIELD

Embodiments of the subject matter described herein relate generally to testing of electronic circuits and devices. More particularly, embodiments of the subject matter relate to methods and apparatus for testing multiple clock domains with a shared capture clock signal.

BACKGROUND

Design for Test (DFT) techniques are widely known and used with many types of microchips, integrated circuits and other microelectronic devices. Generally speaking, "DFT" describes any number of design techniques that allow for the testing of hardware that has been designed or manufactured. Often, DFT structures are implemented within microelectronic products to validate that the product contains no manufacturing or design defects that might adversely affect performance. Test data, for example, is often applied to the manufactured component under test (often using a "scan chain" or series of dedicated registers), and test results are obtained by letting the component process the applied data. If the resulting output matches an expected value, then the component under test can be considered to be functioning normally.

Recent developments in hardware design, however, have made DFT testing even more complicated. Although DFT techniques have long been applied to chips or other circuits that operate in response to a single clock signal, for example, DFT is much more complicated when testing data paths that span multiple chips or other components that are separately clocked. Multi-chip modules (MCMs), for example, can transmit data across multiple dies, chips or other components that each have their own clock signals, thereby making control of the entire data path difficult. Other types of systems (including data processing systems implemented on a common chip, package, circuit board or the like) can experience similar issues.

Although some attempts have been made to apply a test capture clock signal across multiple clock domains, these attempts generally have not been as successful as desired. In particular, prior attempts to use DFT techniques with a common capture clock signal applied to multiple chips or other clock domains have typically resulted in "hold time" errors wherein the time for the input data to propagate through the multi-domain path exceeds the time available to capture the data. It can therefore be relatively challenging to provide effective DFT testing across multiple clock domains.

BRIEF SUMMARY OF EMBODIMENTS

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

According to various embodiments, methods, circuits and systems are provided to test data paths that traverse multiple clock domains using a common capture clock signal that can be applied to any of the different domains. Logic is provided and controlled so that the common capture clock signal is applied to only the domain of interest during appropriate times. The capture clock may be disconnected or otherwise disabled for other domains during these times, thereby eliminating hold time errors and other artifacts of past attempts to provide DFT testing across multiple domains. Various embodiments may further provide override features and/or other enhancements or variations as desired, and as described more fully below.

Some embodiments may provide a method to test a data path that traverses each of a plurality of distinct clock domains. The method suitably comprises generating test data and a common capture clock signal that is shared between each of the plurality of clock domains, launching the test data to a first one of the plurality of clock domains, selecting each of the plurality of clock domains to receive the common capture clock signal while the test data propagates through the selected clock domain, and capturing the test data at a second one of the plurality of clock domains after the test data has propagated through each of the plurality of clock domains.

Other embodiments may provide a circuit to test a data path that traverses a plurality of separate clock domains each having their own clock inputs. The circuit suitably comprises a first plurality of scan cells configured to provide input data to the first one of the plurality of separate clock domains, a second plurality of scan cells configured to provide output data from a second one of the plurality of separate clock domains, and a controller coupled to the first and second pluralities of scan cells. The controller is appropriately configured (e.g., using hardware, software and/or firmware logic) to generate test data and a common capture clock signal that is shared between each of the plurality of separate clock domains, to launch the test data to a first one of the plurality of separate clock domains using the first plurality of scan cells, to select each of the plurality of separate clock domains to receive the common capture clock signal while the test data propagates through the selected clock domain, and to capture the test data from the second plurality of scan cells after the test data has propagated through the second one of the plurality of separate clock domains.

Still other embodiments provide a design-for-test system to test a data path that traverses a first clock domain having a first clock input and a second clock domain having a second clock input. The system comprises a first plurality of scan cells configured to provide input data to the first clock domain, a second plurality of scan cells configured to obtain output data from the second clock domain, clock selection logic coupled receive a shared capture clock signal and to selectively apply the shared capture clock signal to either the first clock input or the second clock input, and a controller coupled to the first and second pluralities of scan cells. The controller is appropriately configured (e.g., using hardware, firmware and/or software logic) to provide the input data to the first plurality of scan cells, to allow the input data to propagate from the first clock domain to the second clock domain to thereby create the output data, to control the clock selection logic to thereby apply the shared capture clock signal to the first clock input when the data is propagating in the first clock domain and to the second clock input when the data is propagating in the second clock domain, and to capture the output data from the second plurality of scan cells.

These and other exemplary embodiments are described in varying levels of detail in the drawings and in the detailed description below.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description of the invention is merely exemplary in nature and is not intended to limit the invention or the application and uses of the invention. Furthermore, there is no intention to be bound by any theory presented in the preceding background or the following detailed description.

As noted above, various embodiments are able to test data paths that span multiple clock domains using a common, shared capture clock signal that is selectively applied to a single active domain as needed. The common capture clock, in addition to being spatially efficient, eliminates the root cause of hold time errors during DFT tests because it can be individually controlled and applied only to the domain of interest at relevant times. Moreover, the concepts and structures used to implement a common capture clock may have additional benefits in certain settings. The single bypass clock structure may provide a convenient mechanism that alleviates the need to run scan capture timing in certain level-sensitive scan design (LSSD) implementations, for example. Additional details about various exemplary concepts, systems and processes are provided below.

Figure 1:
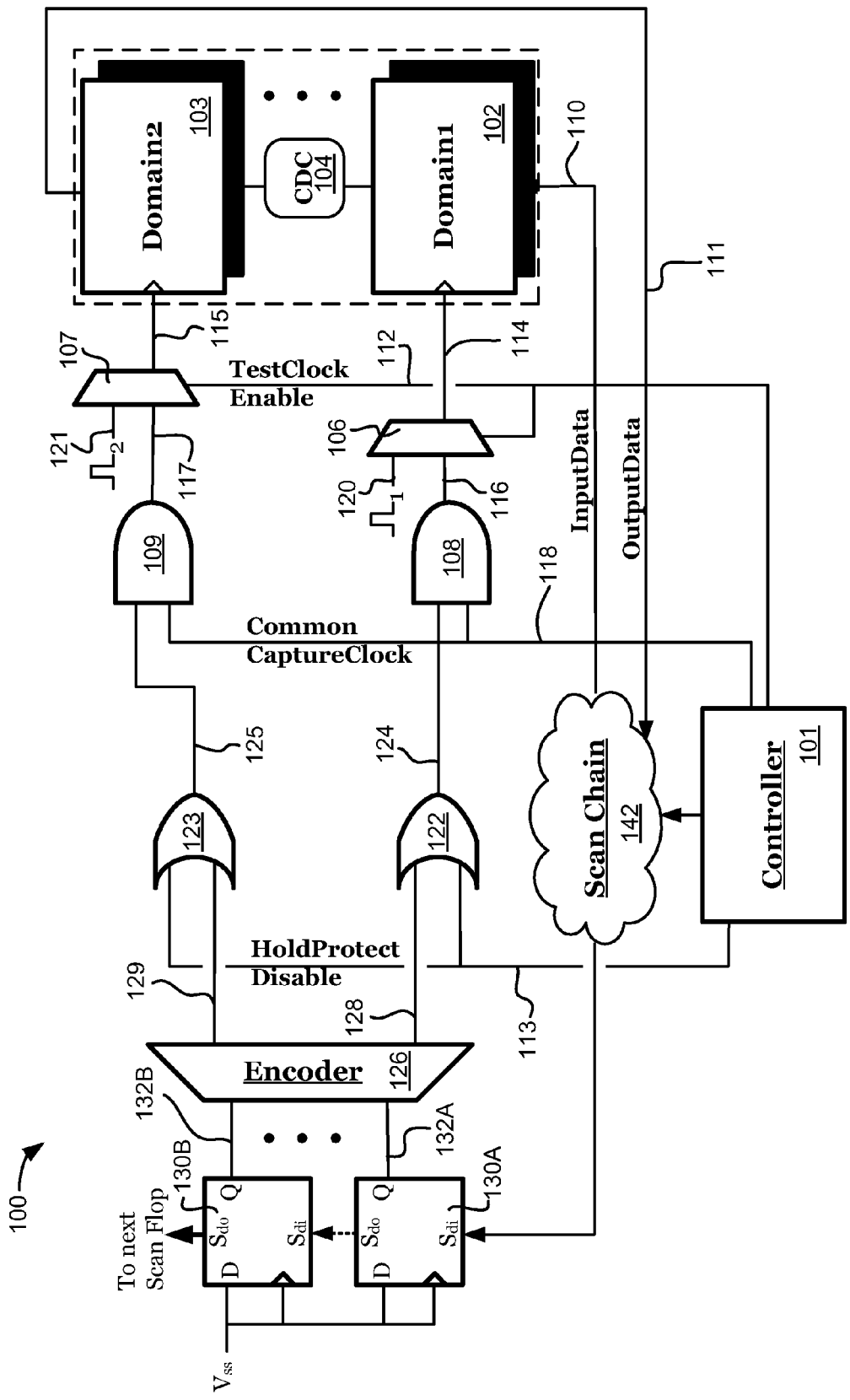
FIG. 1 is a block diagram of an exemplary system and circuit for testing a multi-clock domain data path.

Turning now to the drawing figures and with initial reference to FIG. 1, an exemplary system 100 to test a data path 105 that spans multiple clock domains 102, 103 is shown. This system 100 includes a test circuit that applies input test data 110 provided by a controller 101 to a first clock domain 102 via a scan chain 142 having any number of scan cells or other structures as appropriate. The input data 110 typically represents pseudorandom or other deterministic values that propagate through domain 102 to domain 103. As the data propagates through each clock domain 102, 103, controller 101 suitably applies the shared capture clock signal 118 to only the active domain using appropriate clock selection logic (e.g., logic 108-109, 120-123 and/or the like). Output data 111 representing the processed input data 110 is ultimately captured from output domain 103 and provided back to controller 101 via a scan chain or the like. By sharing a common clock signal between each of the separate clock domains but only activating the shared clock when the particular domain is active, controller 101 is able to eliminate many types of hold time errors that could otherwise result from the application of distinct clock signals.

Controller 101 (or logic responsive to controller 101) therefore provides a common capture clock 118 that can be controlled, switched or otherwise applied to the clock inputs of domains 102 and/or 103 to capture output data 111 from a desired clock domain 102, 103 without incurring significant hold time issues. The common capture clock 118 is relatively space efficient in that it typically can be provided on a single signal pin from the controller 101. The common capture clock 118 nevertheless makes system 100 relatively immune to hold time violations since the particular clock signal applied to any particular domain 102, 103 may be held or otherwise controlled for the domain providing the captured data, thereby eliminating "timeouts" that might otherwise result in an error.

Domains 102, 103 as shown in FIG. 1 represent any sort of circuits, chips, dies, or other components of a system 100 that operate in response to a particular clock input 146, 147 (respectively). Each domain 102, 103 may represent a separate chip or other circuit operating on a common board, package or other substrate, for example. During normal operation, domains 102, 103 typically each receive separate functional clock signals 120, 121 (respectively) that may or may not be related to each other. Clock signals 120 and 121 often exhibit different frequencies, phases and/or other characteristics. In the example illustrated in FIG. 1, only two clock domains 102, 103 are shown. Equivalent embodiments, however could be formulated using more than two domains corresponding to separate chips, circuits, dies and/or other components as desired, and as described more fully below.

The various clock domains may be interconnected using any sort of clock domain crossing (CDC) 104, as desired. Conventional CDC 104 features may include latches, flip-flops, registers or similar logic capable of holding output data from one domain (e.g., domain 102) until the data can be latched into a subsequent domain (e.g., domain 103). Such switching may take place in response to shared capture clock 118, as desired, or in any other manner.

Controller 101 is any internal or external module, circuit, logic or other component(s) capable of directing the testing of domains 102, 103. In various embodiments, controller 101 represents hardware, firmware and/or software test logic that performs conventional DFT tests of chips, circuits or other components. Conventional DFT "stuck at" tests, for example, are commonly performed by applying a predetermined set of data vectors (as input data 110) to one or more domains 102, 103. Such data 110 may be launched, and the results 111 captured, by any sort of internal or external controller 101. In some embodiments, controller 101 is an external component (e.g., a device tester) that communicates with the system under test via signal pins or other DFT interface features as desired. Other embodiments will implement controller 101 as an onboard circuit or other logic, such as a conventional built-in self-test (BIST) module that is provided within a chip or other integrated circuit package.

To test a signal path that encompasses both domains 102 and 103, controller 101 or another source provides a common capture clock signal 118 that can be selectively applied to either of the clock inputs 146, 147 associated with domains 102, 103 (respectively). Controller 101 may also provide a test clock enable signal 112 ("TestClockEnable" in FIG. 1) and/or a hold protect disable signal 113 ("HoldProtectDisable" in FIG. 1), as described more fully below. In the exemplary embodiment shown in FIG. 1, for example, each domain 102, 103 is associated with dedicated clock application logic 108-109 and/or 120-121 that is able to selectively apply the common capture clock signal 118 to each of the particular domains when the test data is propagating through that domain, and to otherwise deactivate the clock signal on the inactive domains to prevent hold time errors as appropriate.

Generally, data 110 is applied to the first domain 102 via a series of scan registers 142 or the like that may be arranged in a serial chain. Scan registers 142 may be a serial chain of latches, flip-flops or other components capable of launching and/or receiving data into one or more domains 102, 103 as desired. FIG. 1 shows captured data 111 being provided back to controller 101 through the same scan chain 142 that delivers input data to domain 102. In practice, however, the input and output structures and logic of controller 101 may be physically and/or logically separated from each other in any manner. That is, input data may be launched to the first domain in the test sequence (e.g., domain 102) using a chain of write-only gates, while output data may be captured from another domain (e.g., domain 103) using a different chain of read-only gates. Equivalent embodiments may use any other chains or other combinations of read only, write only and/or read/write gates as desired.

Scan chain 142 may also include one or more gates 130A-B that provide domain selection signals 132A-B (respectively) to an encoder 126. In such embodiments, the selection signals used to select the active domain 102-103 to receive the common capture clock 118 can be provided as part of the input test data chain, thereby removing the need for separate control outputs from controller 101. Other embodiments may simply provide domain selection signals 132A-B from one or more output pins of controller 101, as desired.

The particular domains 102, 103 may be selected according to any predetermined, random, pseudo-random or other temporal basis as appropriate for the particular test data 110 that is applied. Further, the amount of time that each domain 102, 103 remains active can vary as needed to allow the data to propagate through the particular domain 102, 103 that is selected. Various automatic test pattern generation (ATPG) tools, for example, are able to control clock signal 118 as it is applied to the various domains 102-103 within system 100 so that each domain 102-103 receives adequate time for data to propagate though the particular domain, as needed.

The number of selection signals 132A-B will vary in accordance with the number of separate clock domains 102-103 that are independently selected. In the exemplary embodiment shown in FIG. 1, two selection signals 132A-B are provided using two selection gates 130A-B. Using conventional binary logic, these two signals would be able to select between four different output channels of encoder 126. By changing the number of selection gates 130A-B and/or selection signals 132A-B, the number of controllable channels can be increased or decreased as desired. A single selection signal 132, for example, would typically be sufficient to select between two domains 102-103, whereas six selection signals 132 would be sufficient to support sixty-four ($2^6$) different domains using a 6-to-64 encoder 126. As noted above, the general concepts described herein may be adapted as appropriate to support any number of distinct clock domains as desired.

Encoder 126 therefore responds to any number of domain selection signals 132A-B to select one of the separate clock domains 102-103 to receive the shared capture clock signal 118. In the example shown in FIG. 1, additional logic allows efficient application of the common clock signal 118 to any of the various domains 102, 103. Various embodiments may also provide logic that enables several different modes of operation.

Each independently-selectable clock domain 102, 103 may be associated with any number of gates, circuits, switches or other logic that enhances functionality as desired. Logic 122, 123, for example, provides an output signal 124, 125 (respectively) that indicates that shared capture clock signals 118 should be applied to the associated domain 102, 103 (respectively). If controller 101 provides appropriate selection signals 132A-B to select domain 102, for example, encoder 126 will typically activate output 128 while simultaneously deactivating the remaining outputs (e.g., output 129 to domain 103). Encoder 126 will typically "activate" an output by generating a suitable digital or other electronic indication on that output line. This signal may be further processed by electrical or electronic circuitry as desired.

Logic 122, 123 is shown in FIG. 1 using OR gates to indicate that the output signals 124, 125 are active when either the encoder output 128, 129 for that domain is active, or a common "hold protect disable" signal 113 is active. Hold protect signal 113 in this example appropriately allows all of the domains 102, 103 to simultaneously receive the shared clock signal 118. This feature, while not typically used during conventional stuck at testing, may nevertheless provide a convenient mechanism that facilitates other types of "stress" tests (e.g., burn-in or high voltage tests) wherein it is helpful to toggle many different gates simultaneously. Hold protect disable signal 113 therefore suspends the hold protection feature while allowing other tests to use the common capture clock signal 118 for other purposes. Equivalent embodiments may not need or use the disable feature, so logic 122-123 may be omitted in some implementations. In those cases, encoder outputs 130A-B may be directly provided as capture clock enable signals 124-125, or other techniques may be applied as desired.

Logic 108-109 suitably provides the shared capture clock signal 118 for the selected domain 102-103 as indicated by the capture clock enable signal 124-125 (respectively). FIG. 1 shows logic 108-109 as conventional AND gates to reflect that the capture clock 118 is provided as the output when signals 124, 125 indicate that the capture clock is enabled for that domain.

Logic 106-107 appropriately selects the appropriate clock signal to be applied to the clock inputs 146, 147 of domains 102, 103 (respectively). In the example shown in FIG. 1, logic 106-107 is implemented using a multiplexor or other selectable switch that responds to a test clock enable signal 112 provided by controller 101. When signal 112 is disabled, logic 106, 107 appropriately applies the functional clock signals 120, 121 that are generally associated with the domain 102, 103 (respectively) during normal operation. When signal 112 is enabled, logic 106, 107 suitably applies the test clock signals 116, 117 that emanate from logic 108-109 associated with the particular domain 102, 103 (respectively). If domain 102 is activated in the test mode, for example, clock signal 114 applied to clock input 146 would reflect the common capture clock 118. Alternatively, if test mode is not indicated by signal 112, then clock signal 114 would apply the functional clock 120 to clock input 146.

In operation, then, controller 101 is able to test a data path that encompasses multiple clock domains 102, 103 by launching test data 110 to a first domain 102 (e.g., via a conventional scan chain 142), allowing the test data 110 to propagate through domain 102 to domain 103 via CDC 104, and then capturing output data 111 from output domain 103. The input data propagates through each of the separate clock domains 102-103 in response to a common capture clock signal 118 that is selectively applied to each of the separate clock domains by logic that appropriately responds to controller 101. Various other structures, arrangements and components may be provided in any number of alternate embodiments that may differ from the example shown in FIG. 1. The "AND" and "OR" gates shown in FIG. 1, for example, could be equivalently implemented using other logic gates or structures. The data signaling schemes used in FIG. 1 could be modified (e.g., certain signals could be inverted, enhanced, combined or eliminated) in many different ways.

Figure 2:
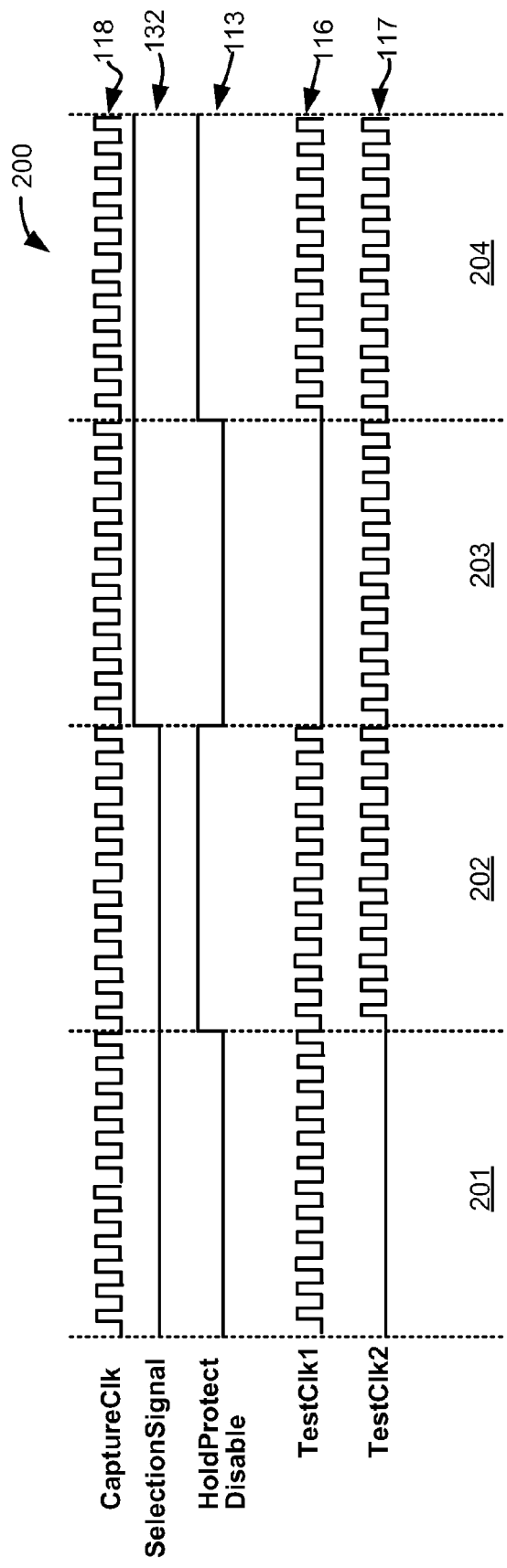
FIG. 2 is a timing diagram showing exemplary signals that could be generated and applied to test a multi-domain data path.

FIG. 2 shows an exemplary timing diagram 200 that illustrates the various test clock signals 116, 117 that could be generated in an exemplary embodiment. The particular example illustrated in FIG. 2 shows a common capture clock 118, a domain selection signal 132 that selects between two domains (e.g, domains 102 and 103 in FIG. 1), and a hold protect disable signal 113 as described above. Each of these signals may be generated by a common controller 101, as desired. Although this example uses a single domain selection signal 112 to switch between two domains for simplicity, equivalent embodiments could readily adapt the concepts set forth in FIG. 2 to any number of different domains, as desired.

In the embodiment shown in FIG. 2, each test clock signal 116, 117 generally provides the common capture clock signal 118 when its associated domain 102, 103 is indicated by selection signal 132, or when the hold protect disable signal 113. Test clock signals 116, 117 are therefore both shown to provide the common clock when the hold protect signal 113 is active (as described above with respect to logic 122, 123). When the hold protect signal 113 is inactive (e.g., time periods 202, 204), the test clock signals 116, 117 only provide the shared capture clock 118 when the particular domain 102, 103 is selected by signal 132 (e.g., time periods 201, 202 for test clock 116; time periods 203, 204 for test clock 117 in this example). Again, equivalent embodiments may use other signaling or logic conventions that differ from those of FIG. 2.

Figure 3:
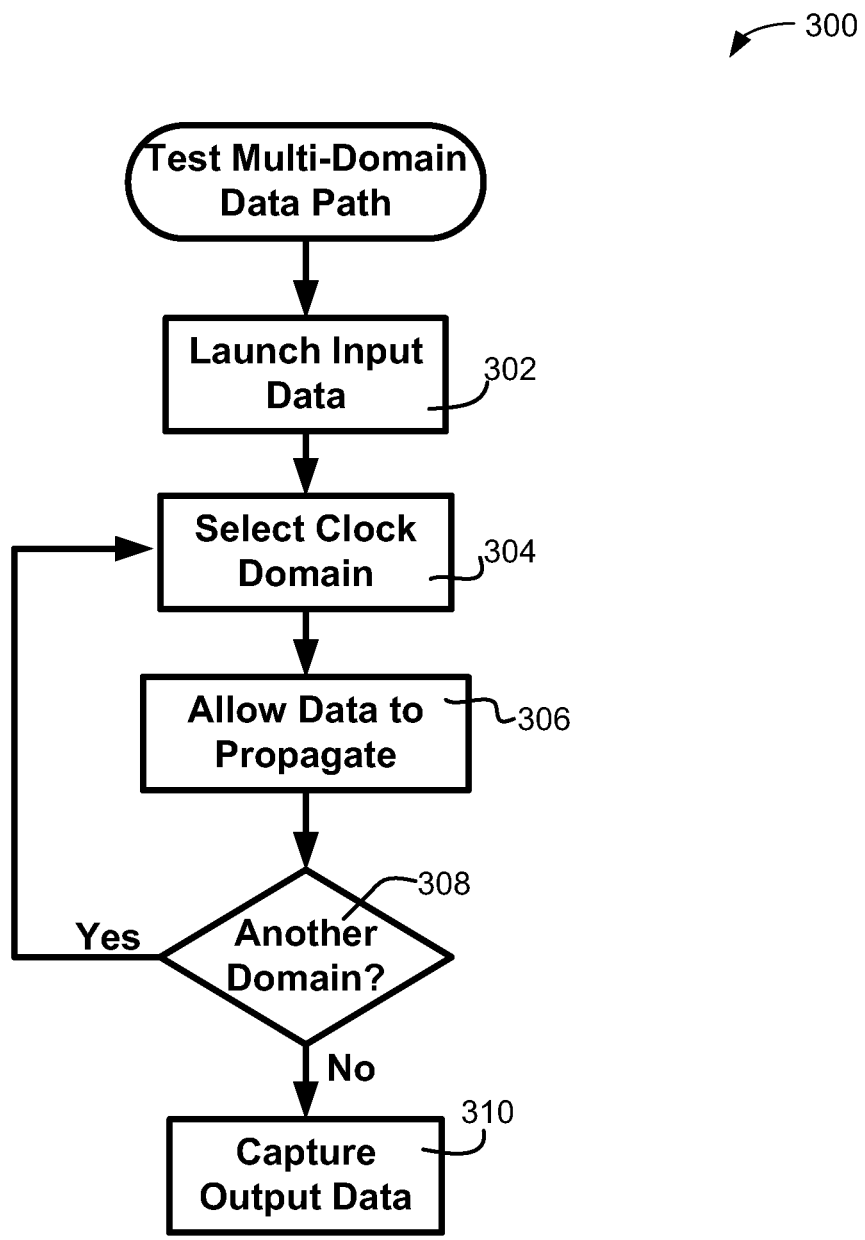
FIG. 3 is a flowchart of an exemplary process for testing a multi-domain data path.

FIG. 3 shows one example of a process 300 that could be executed by a controller 101 or by any other component to implement a DFT test of a logic path that traverses more than one chip, circuit or other clock domain. The various functions shown in FIG. 3 may be implemented in any sort of conventional hardware, firmware and/or software logic as desired, such as in a circuit or chip tester device, a BIST module and/or other controller 101.

Input test data 110 is appropriately launched or otherwise provided by controller 101 to the test path as appropriate (function 302). As described above, test data 110 is any sort of deterministic data or the like that is applied to a first chip, circuit or other clock domain 102 using serial or parallel scan gates in scan chain 142, or in any other manner. Appropriate vectors or other test data 110 can be generated by controller 101 and propagated though the various domains 102, 103 as needed to perform stuck-at or other testing. Test data 110 may be generated in any manner; in various embodiments the test data 110 is simply retrieved from memory or other storage, or otherwise generated in any appropriate manner.

The input data 110 is initially applied to one of the separate clock domains (e.g., domain 102 in FIG. 1), where it is processed as appropriate. Generally speaking, each domain 102, 103 is selected in turn to receive the shared capture clock signal 118 (function 304) at such times as appropriate to allow the processed data 110 to propagate through the domain (function 306). The processed input data 110 then propagates to one or more additional clock domains (e.g., clock domain 103) via CDC 104 or the like for further processing (function 308) until all of the clock domains 102, 103, as desired. Various test sequences may apply input data 110 to any number of different domains 102, 103 in any sequential or other order. The data applied for the particular test sequence is then controlled by selecting the domain 102, 103 to receive the shared clock signal 118 for the particular times that the data 110 is propagating through the particular domain 102, 103 until all of the domains 102, 103 in the test series have been traversed. Various test sequences could test any number of different data processing paths that traverse any number of domains 102, 103 in any order, and different sequences may be applied using controller 101 as desired.

Any number of active domains 102, 103 may be selected to receive the shared capture clock signal 118 in any manner (function 304). As noted above, hold time errors may be eliminated if the common clock signal 118 is applied to only a single domain 102, 103 at a time. One technique for providing such "one hot" selection of clock domains 102, 103 is described above with respect to FIG. 1. In that example, the active clock domain is selected by providing one or more selection signals 132A-B to an encoder 126 that selects only a single domain 102, 103 at a time. As noted above, the selection signals 132A-B may be provided through scan chain 142, through direct application from controller 101 to encoder 126, and/or in any other matter. Selection function 304 may also involve generation and/or application of hold protect disable signal 113 (e.g., using logic 122-123), test clock enable signal 112 (e.g., using logic 106-107), and/or other functions (e.g., logic 108-109) as described above. The separate clock domains 102, 103 are selected with appropriate timing and for appropriate times (as determined by an ATPG tool or the like) to allow the applied input data 110 to propagate through the domains, as needed for the particular test sequence (function 308).

The output data 111 is appropriately captured (function 310) after the input data 110 has been processed by each of the clock domains 102, 103 in the test path. As noted above, data may be captured through a scan chain of dedicated DFT registers (e.g., part of scan chain 142, or a separate read chain as desired), or through any other technique. Output data 111 is suitably compared to expected values to confirm that the data path through domains 102, 103 is functioning properly. If discrepancies are found between the output data 111 and any expected values, then further investigation may be warranted to identify the source of the discrepancy. Other testing techniques may be equivalently applied in any number of other embodiments. Some embodiments may, for example, apply stress testing using hold protect disable signal 113; other embodiments may perform additional or alternate tests as desired.

As described above, then, controller 101 within system 100 is able to selectively apply the shared capture clock signal 118 to each of the separate clock domains 102-103 as desired. By providing appropriate domain selection signals 132A-B to gates 130A-B via scan chain 142, for example, input test data 110 can be clocked through domain 102 and/or domain 103 using a common clock that is selectively applied to the different domains as the data propagates through the system 100. Output data 111 can then be captured from an output domain (e.g., domain 103) that is different from the input domain (e.g., domain 102) without substantial concern for hold time errors. Other embodiments may provide additional or alternate functions and/or structures as desired.

While several exemplary embodiments have been presented in the foregoing detailed description, it should be appreciated that a vast number of alternate but equivalent variations exist, and the examples presented herein are not intended to limit the scope, applicability, or configuration of the invention in any way. To the contrary, various changes may be made in the function and arrangement of elements described without departing from the scope of the claims and their legal equivalents.

The preceding description refers to elements or nodes or features being "connected" or "coupled" together. As used herein, unless expressly stated otherwise, "coupled" means that one element/node/feature is directly or indirectly joined to (or directly or indirectly communicates with) another element/node/feature, and not necessarily mechanically. Likewise, unless expressly stated otherwise, "connected" means that one element/node/feature is directly joined to (or directly communicates with) another element/node/feature, and not necessarily mechanically.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method to test a data path that traverses each of a plurality of distinct clock domains, the method comprising:
   generating test data and a common capture clock signal that is shared between each of the plurality of clock domains;
   launching the test data to a first one of the plurality of clock domains;
   for each clock domain of the plurality of clock domains, providing a selection signal to an encoder to thereby select the clock domain to receive the common capture clock signal while the test data propagates through the selected clock domain, wherein the encoder provides a plurality of encoder outputs configured to provide a unique domain select signal to each of the plurality of clock domains, and wherein the encoder is configured to activate only a single one of the encoder outputs in response to the selection signal; and
   capturing the test data at a second one of the plurality of clock domains after the test data has propagated through each of the plurality of clock domains.

2. The method of claim 1, wherein the selecting comprises applying the common capture clock signal to only the selected clock domain while the test data propagates through the selected clock domain, and disengaging the common capture clock signal from each of the other clock domains that are not selected.

3. The method of claim 1 wherein the launching comprises applying the test data to the first one of the plurality of clock domains via a scan chain.

4. The method of claim 3 wherein the selecting is performed by providing control signals to an encoder using a portion of the scan chain.

5. The method of claim 1 wherein launching comprises applying the test data and at least one selection signal to a scan chain, and wherein the at least one selection signal is applied from the scan chain to an encoder that selects the selected clock domain.

6. The method of claim 1 wherein the generating further comprises generating a hold protect signal that allows the common capture clock signal to be simultaneously applied to all of the plurality of clock domains.

7. The method of claim 1 further comprising providing an enable signal that switches between a first mode in which each of the plurality of clock domains receives a unique functional clock signal and a second mode in which each of the plurality of clock domains receive the common capture clock signal when the clock domain is selected.

8. The method of claim 7 wherein the generating further comprises generating a hold protect signal that allows the common capture clock signal to be simultaneously applied to all of the plurality of clock domains in the second mode.

9. A circuit to test a data path that traverses a plurality of separate clock domains each having their own clock inputs, the circuit comprising:
   a first plurality of scan cells configured to provide input data to the first one of the plurality of separate clock domains;
   a second plurality of scan cells configured to provide output data from a second one of the plurality of separate clock domains;
   a controller coupled to the first and second pluralities of scan cells, wherein the controller is configured to generate test data and a common capture clock signal that is shared between each of the plurality of separate clock domains, to launch the test data to a first one of the plurality of separate clock domains using the first plurality of scan cells, to select each of the plurality of separate clock domains to receive the common capture clock signal while the test data propagates through the selected clock domain, and to capture the test data from the second plurality of scan cells after the test data has propagated through the second one of the plurality of separate clock domains; and
   an encoder comprising a plurality of encoder outputs each configured to provide a unique domain select signal to one of the plurality of separate clock domains, wherein the encoder is configured to activate only a single one of the encoder outputs in response to one or more selection signals generated by the controller.

10. The circuit of claim 9 wherein the controller is configured to select each of the plurality of separate clock domains by providing the one or more selection signals to the first plurality of scan cells.

11. The circuit of claim 10 wherein the encoder is responsive at least one of the first plurality of scan cells to receive the one or more selection signals and to select the selected one of the plurality of separate clock domains in response to the selection signals.

12. The circuit of claim 9 further comprising, for each of the plurality of separate clock domains, a first logic responsive to one of the domain select signals received from the encoder and to a hold protect signal generated by the controller, wherein a first output of the first logic enables the application of the common capture clock signal to the domain when either of the domain select signal or the hold protect signal is activated.

13. The circuit of claim 12 further comprising, for each of the plurality of separate clock domains, a second logic responsive to the first output of the first logic and to the common capture clock signal to thereby produce a second output that represents the common capture clock signal when the first output is enabled.

14. The circuit of claim 13 further comprising, for each of the plurality of separate clock domains, third logic that selects, responsive to an enable signal provided by the controller, between a functional clock signal and the second output for application to the clock input of the clock domain.

15. A design-for-test system to test a data path that traverses a first clock domain having a first clock input and a second clock domain having a second clock input, the system comprising:
   a first plurality of scan cells configured to provide input data to the first clock domain;
   a second plurality of scan cells configured to obtain output data from the second clock domain;
   clock selection logic coupled receive a shared capture clock signal and to selectively apply the shared capture clock signal to either the first clock input or the second clock input; and
   a controller coupled to the first and second pluralities of scan cells, wherein the controller is configured to provide the input data to the first plurality of scan cells, to allow the input data to propagate from the first clock domain to the second clock domain to thereby create the output data, to control the clock selection logic to thereby apply the shared capture clock signal to the first clock input when the data is propagating in the first clock domain and to the second clock input when the data is propagating in the second clock domain, and to capture the output data from the second plurality of scan cells, wherein the clock selection logic comprises an encoder having a plurality of encoder outputs each configured to provide a unique domain select signal to one of the plurality of separate clock domains, and wherein the encoder is configured to activate only a single one of the encoder outputs in response to selection signals generated by the controller.

16. The design-for-test system of claim 15 wherein the encoder is responsive at least one of the first plurality of scan cells to receive the selection signals generated by the controller and to select the selected one of the plurality of separate clock domains in response to the selection signals.

17. The design-for-test system of claim 15 wherein the controller is a built in self test (BIST) module provided in a common package with the first and second clock domains.

18. The design-for-test system of claim 15 wherein the controller is an external test controller that interfaces with the first and second clock domains via interface pins.

* * * * *